Figure 1A:
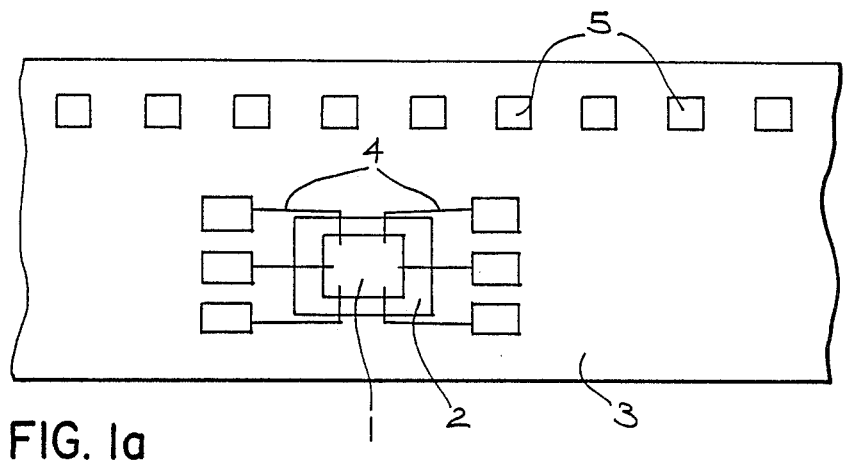

United States Patent [19]

Haghiri-Tehrani et al.

[11] Patent Number: 4,803,542

[45] Date of Patent: * Feb. 7, 1989

[54] CARRIER ELEMENT FOR AN IC-MODULE

[75] Inventors: Yahya Haghiri-Tehrani; Joachim Hoppe, both of Munich, Fed. Rep. of Germany

[73] Assignee: Gao Gessellschaft fur Automation und Organisation mbH, Fed. Rep. of Germany

[*] Notice: The portion of the term of this patent subsequent to Nov. 24, 2004 has been disclaimed.

[21] Appl. No.: 51,850

[22] Filed: May 18, 1987

Related U.S. Application Data

[63] Continuation of Ser. No. 649,159, Sep. 10, 1984, which is a continuation of Ser. No. 288,384, Jul. 31, 1981.

[30] Foreign Application Priority Data

Aug. 5, 1981 [DE] Fed. Rep. of Germany ....... 3029667

[51] Int. Cl.$^4$ .................... H01L 23/30; H01L 23/14; H01L 23/48
[52] U.S. Cl. ....................................... 357/72; 357/74; 357/80
[58] Field of Search ....................... 357/80, 75, 71, 68, 357/74, 72; 235/492; 361/414; 174/52 FP, 52 PE

[56] References Cited

U.S. PATENT DOCUMENTS

| 3,848,077 | 11/1974 | Whitman | 174/52 FP |
| 4,064,552 | 12/1977 | Angelucci et al. | 361/414 |
| 4,264,917 | 4/1981 | Ugon . | |
| 4,709,254 | 11/1987 | Haghiri-Tehrani et al. | 357/72 |

FOREIGN PATENT DOCUMENTS

| 0037760 | 10/1981 | European Pat. Off. . | |
| 2081974 | 2/1982 | United Kingdom | 174/52 PE |
| 2086134 | 5/1982 | United Kingdom . | |
| 2093401 | 9/1982 | United Kingdom . | |

Primary Examiner—Andrew J. James
Assistant Examiner—S. V. Clark
Attorney, Agent, or Firm—Andrus, Sceales, Starke & Sawall

[57] ABSTRACT

A carrier element for an IC-module for incorporation into an identification card. The element includes a flexible carrier film supporting conductive leads and contact pads. A semi-conductor chip is electrically connected to the leads and pads. Cast resin surrounds the chip and carrier film, including the carrier pads, to form a solid carrier element capable of resisting mechanical stresses.

3 Claims, 3 Drawing Sheets

CARRIER ELEMENT FOR AN IC-MODULE

The present application is a continuation of U.S. patent application Ser. No. 06/649,159 filed Sept. 10, 1984, now U.S. Pat. No. 4,709,254. That application is, in turn, a continuation of U.S. patent application Ser. No. 06/288,384, filed July 31, 1981 and now abandoned.

The invention concerns a carrier element for an IC module for incorporation into identification cards or similar data carriers.

The German patent application P No. 29 20 012 of the applicant describes an identification card with an embedded integrated circuit. For the production of the cards a so-called intermediate product (carrier element) is employed which accepts the IC module with all its contact elements and can be produced as a self-contained unit independently of the production of the cards.

The carrier element, which can have a circular, box-type construction, is produced by using several films in a cold lamination process.

IC identification cards and other data carriers equipped with similar electronic circuits have essential advantages compared to the usual cards for machine use, based on their greater storage capacity and their ability to participate actively in communication processes. These additional advantage relative to usual identification cards quite considerably increase the number of possibilities of application for identification cards and open up a few entirely new areas of application.

The production of IC identification cards in very large numbers is necessary for the application of these types of identification card systems. It is therefore very important for the production of carrier elements, as well, to be able to apply a method which is economical for large numbers of items. It must be taken into consideration that the semiconductor wafer and its connecting leads are exposed to great stress during the production of the identification cards and their handling.

It must also be taken into consideration that in the case of identification cards of the above-mentioned type very different demands are made in the various areas of application as far as the mechanical stability, the durability, the resistance to environmental influences and so on are concerned. Due to the possibility of active communication this also applies, of course, to the contact areas of the integrated circuit as well as to the mechanical construction of the card.

Several contacting methods (e.g. galvanic, capacitive, optical, etc.) have become known in the course of the development of IC identification cards. The selection of one method over another for the production of carrier elements depends on the area of application of the identification cards, the technical resources in production, the desired constancy of performance and other factors.

The object of the invention thus consists in creating a carrier element to be applied to identification cards or similar data carriers which can be produced economically in large numbers, offers good protection for the embedded semiconductor wafer and its connecting leads, and can be adjusted in production to various demands with respect to the durability of the cards and the type of contacting without any elaborate adapting steps.

The object is achieved according to the invention by casting a semiconductor wafer bonded on a foil, if necessary along with additional layers, with a casting material to a compact unit of predetermined thickness.

In the past many methods of contacting semiconductor wafers, i.e. of providing the tiny contact surfaces of the silicon crystal with contacts appropriate for subsequent use, have become known.

For example, the contact surfaces of the crystal are connected in so-called bonding automatic equipment with the connection legs of a contact spider by fine golden wires, whereby the contact spider also serves as the carrier of the semiconductor wafer.

Other methods use flexible material as a carrier for the wafers (see DE-AS No. 24 14 297). The non-conductive material (e.g. in the form of a super-8 film) is provided with windows at equal intervals, into which windows the self-supporting ends of a contact spider etched out of conductive material extend. All the contact surfaces of the wafer are connected in synchronism with the contact spider, which considerably increases the economic efficiency of the contacting method compared to older methods.

The semiconductor wafers can also be mounted on a film without windows in a similar manner.

The invention uses these established and rational production methods and thus attains an intermediate product which is particularly well suited for the production of carrier elements in large numbers and can be processed to all sorts of carrier elements without much effort and taking into account the above-mentioned relevant requirements.

Due to the employment of the casting technique, carrier elements with all sorts of properties (durability, contacting) can be realized without any expensive adapting steps. Furthermore, the semiconductor wafers and connection leads are given excellent protection against mechanical stress when the carrier elements are produced by the casting technique.

Figure 1B:
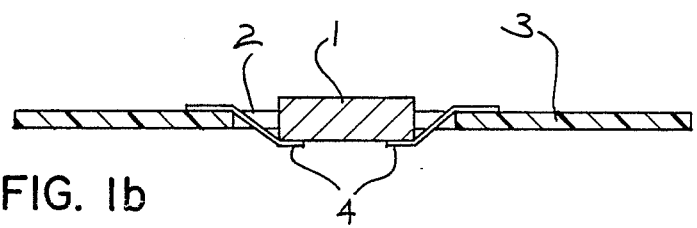
Figure 2:
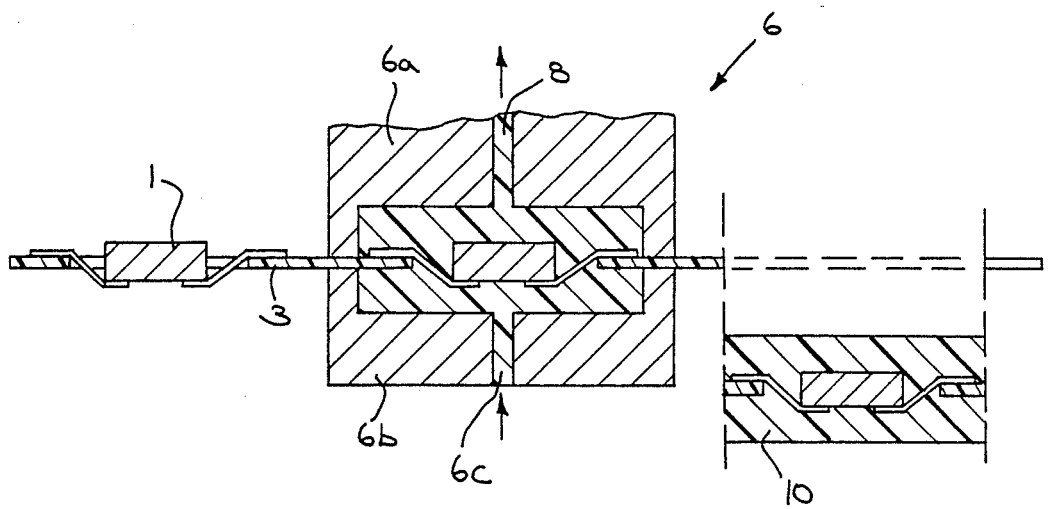
Figure 3:
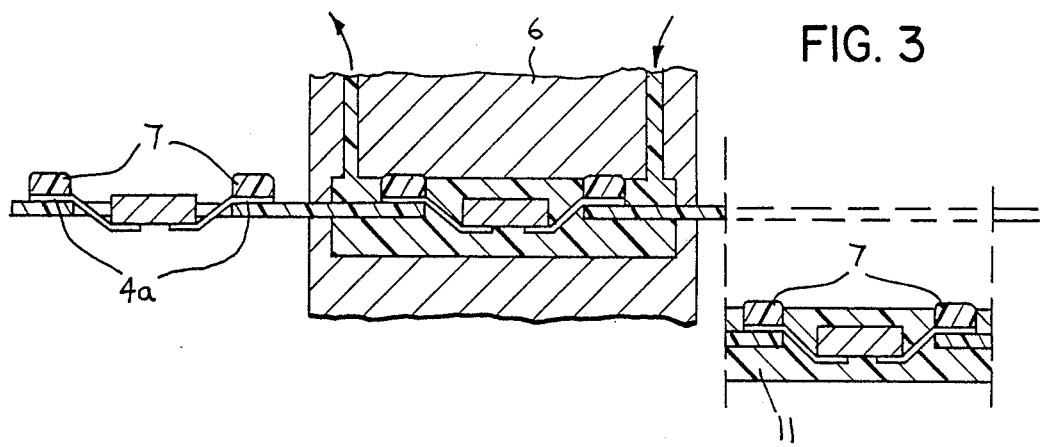
Figure 4:
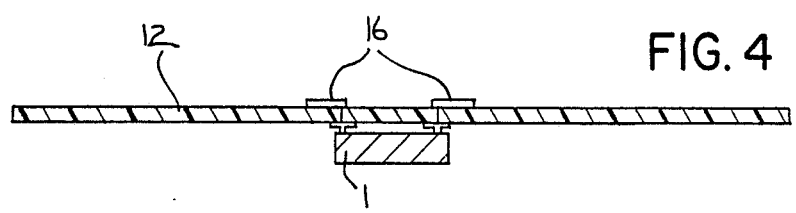
Figure 5A:
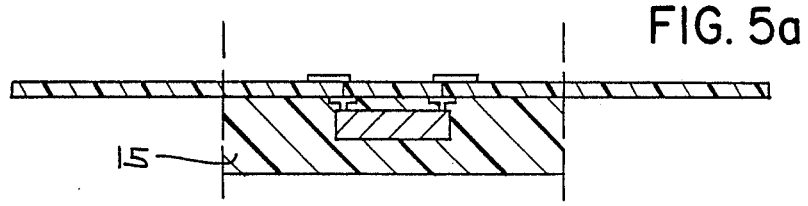
Figure 5B:
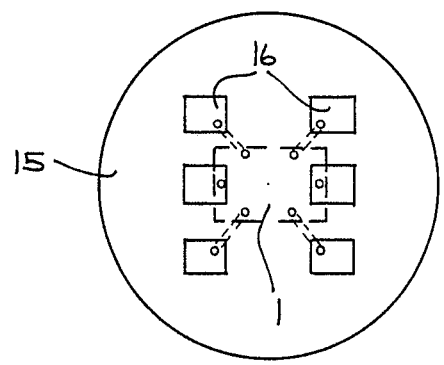
Figure 6:
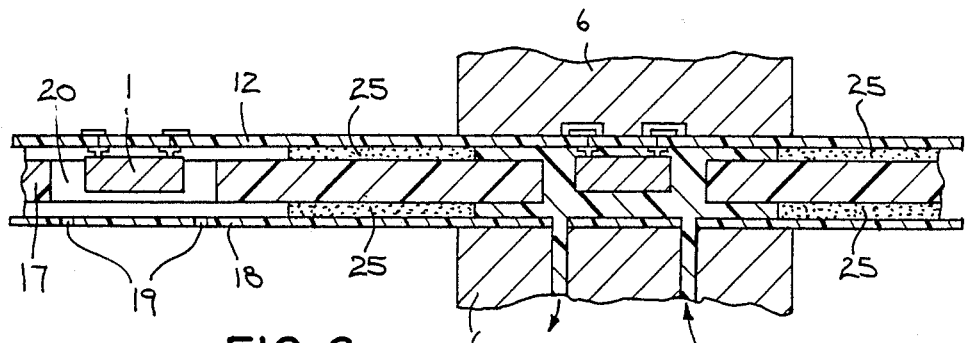
Figure 7A:
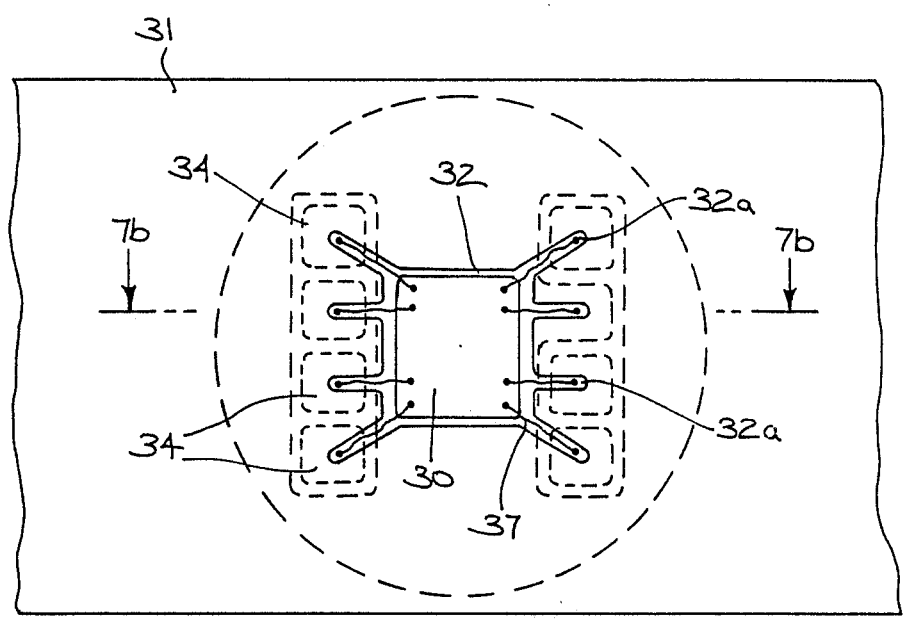
Figure 7B:
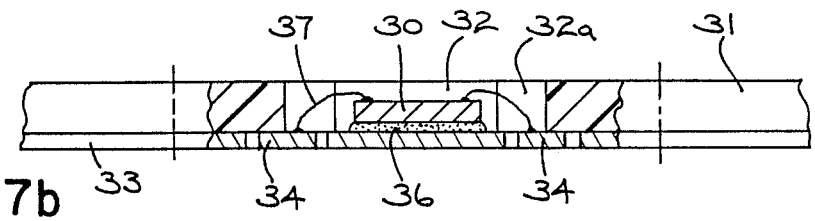
Figure 8:
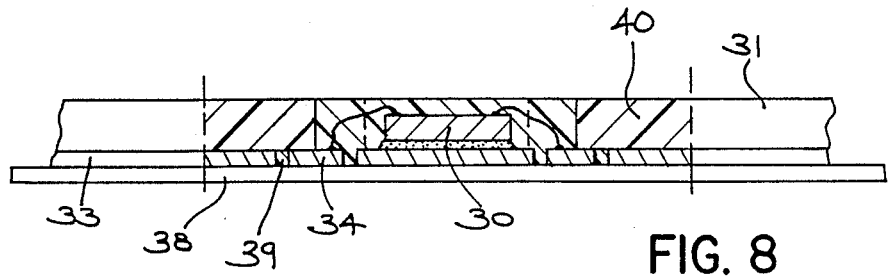

Further features and advantages of the invention can be seen in the description of the embodiments. The drawings show the following:

FIGS. 1a, 1b top view and cross-section of a semiconductor wafer, bonded on a foil FIG. 2 a carrier element produced by the casting technique, suitable for indirect (contactless) contacting, FIG. 3 a carrier element produced by the casting technique, suitable for direct contacting, FIG. 4 a semiconductor wafer attached to a through hole plated film, FIGS. 5a, 5b cross-section and top view of a carrier element produced by the casting technique by using the through hole plated film, FIG. 6 a carrier element produced by the casting technique by using the through hole plated film and additional layers, FIGS. 7a, 7b top view and cross-section of a semiconductor wafer, bonded on a foil when the bonding technique is being employed and FIG. 8 the arrangement of FIG. 7 after the casting process FIGS. 1a and 1b show a semiconductor wafer embedded in a film window from the top and in cross-section.

The semi-conductor wafer 1, arranged in a punched out window 2 of film 3, is connected in the appropriate automatic equipment with the ends of a contact spider 4 etched in a previous operation. The transport of the film 3 during the various operational phases can be carried out very precisely with the help of the perforated holes 5 of the film.

A carrier element that can be produced very simply by using the intermediate product shown in FIGS. 1a and 1b is shown in FIG. 2.

The film 3 that is contacted with the semiconductor wafers 1 is directed to a casting unit 6. The two mold halves 6a and 6b are arranged perpendicularly movable with respect to the film level. The casting unit is filled with an appropriate casting material via a feed channel 6c. The drain channel 8 prevents air pockets from forming in the casting unit during the casting process. Casting arrangements of this sort are known, so that it is not necessary to go into detail here. The solidity of the finished carrier elements can be varied within wide limits by the choice of the casting material.

The carrier element produced according to the representation in FIG. 2, which can be punched out of the carrier film as a compact unit 10 after the casting process, is suitable, for example, for indirect (contactless) accessing as by capacitive or optical means.

FIG. 3 shows a carrier element which is suitable for direct, galvanic contacting.

For the production of this carrier element, the contact surfaces 4a are initially coated before the casting process, so that bumps 7 are formed over the contact surfaces. The coating can consist of conductive material, which is, for example, galvanically applied to the contact surfaces.

The coating can also consist of a non-conductive, elastic material (e.g. silicone), which is, for example, applied to the contact surfaces with a wiper by using an appropriate mask. The arrangement thus provided with bumps 7 is finally directed back into an appropriate casting unit and punched out of the carrier film as a compact unit 11 after the casting process. The bumps 7 can be formed in such a way that they extend slightly out of the cast block 11. In the case of this carrier element the contact surfaces are then on the same level as the cover film surface of the identification card after the carrier element has been incorporated into the card.

If conductive material is used to form the bumps the carrier element is suitable for galvanic (direct) contacting.

If the bumps are formed out of non-conductive material, needles, for example, can be used for contacting, which are directed through the non-conductive material (e.g. silicone) onto the actual contact surfaces 4a. This latter embodiment is advantageous insofar as the contact surfaces of the 10 carrier element are well protected from environmental influences.

The above-mentioned embodiments use for their intermediate products an arrangement in which the semiconductor wafers are connected in a self-supporting way in punched out windows of a film with the appropriate connection leads. A disadvantage of this type of arrangement can result in certain cases of application when as small an interval as possible is required between the contact surfaces. In the case of the above-mentioned arrangements the minimal distance of the contact surfaces is determined by the size of the punched out window and thus by the size of the semiconductor wafer. In order to obtain as small a distance as possible between the contact surfaces, it is also possible to employ the arrangement shown in FIG. 4 as an intermediate product.

The contact surfaces 16 arranged on both sides of the film 12 are connected with each other by a throughplating process. The semiconductor wafer 1 is applied to the film prepared in this way by the known techniques.

FIGS. 5a, 5b show the carrier element 15 produced by using the above-mentioned intermediate product in cross-section and from the top. The casting process can be carried out similarly to the manner described in connection with FIG. 2. As shown in FIG. 5b, the use of this latter intermediate product allows for a closely adjacent arrangement of the contact surfaces 16.

FIG. 6 shows a carrier element for which a so-called through hole plated film is also used as an intermediate product. This arrangement is characterized by extremely great rigidity.

The carrier element consists in this case of 10 a so-called through hole plated film 12, a spacing film 17 and a rearward cover film 18. The rearward cover film is provided with openings 19 which allow for the inflow and draining of the casting material in the casting unit. The spacing film 17 has hollows 20 at regular intervals to accept the semiconductor wafers. In the casting unit the hollow 20 is filled with an appropriate casting material. During the casting process a part of the casting mass also penetrates between the various films, so that the latter are connected with each other particularly well. Between the semiconductor wafers the various films 12, 17, 18 are connected with each other in this example by an appropriate adhesive 25. In this way the penetration of the casting mass into the interstices is made easier and simultaneously restricted. The restriction of the casting mass can, of course, also be achieved by pressing the film compound together on both sides of the casting unit.

The rigidity of the arrangement can be further improved by using films made of epoxy resin reinforced by glass fiber (GEP) and having the resin chosen for the production of the films be identical to the casting mass. In this case the casting mass also penetrates between the various films, which allows for the production of a carrier element with great rigidity and a compact construction.

FIGS. 7a and 7b show a further embodiment of an employable intermediate product for the production of carrier elements. The semiconductor wafer 30 shown here is contacted by the so-called bonding technique. For this purpose the carrier film 31 is initially punched out at regular intervals in such a way that the recess 32 with its finger-shaped extensions 32a as shown in the figures results. Then the carrier film 31 is laminated over its entire surface with a film 33 of 10 conductive material. According to known etching techniques the areas 34 are now isolated from this film, which areas form the contact surfaces of the finished carrier element.

The carrier film prepared in this manner is finally provided, with semiconductor wafers in commercial bonding automatic equipment. In the process one wafer 30 at a time is set into the recess 32 and attached to the conductive film 33 by aid of an appropriate adhesive 36. Then the connection points of the wafer 30 are connected with the contact surfaces 34 by fine golden wires 37.

FIG. 8 shows the carrier element 40 produced according to FIGS. 7a and 7b, in which the recess 32 with its finger-shaped extensions 32a is filled, for example, with an appropriate resin in a casting unit of the above-mentioned kind. In the process the resin also penetrates into the areas 39 between the contact surfaces 34 that arose during the etching process. The filling of the hollows does not necessarily have to be carried out in one of the casting units shown above in the case of the latter arrangement.

If the arrangement is sealed on one side, as shown in FIG. 8, for example with a self-adhesive film 38, the hollows can be easily filled with a resin. The self-adhesive film, which is removed before further processing of the carrier element, simultaneously offers good protection to the contact surfaces, in case the carrier elements are to be stored for long periods.

What is claimed is:

1. A carrier element for an IC-chip suitable for incorporation, as a unit, into a financial or identification card, said carrier element comprising:
    a single layer carrier stratum having an aperture with a periphery, said carrier stratum further having recesses outside the periphery of said aperture through said stratum;
    an electrically conductive film laminated to said carrier stratum and spanning said recesses;
    contact surfaces formed out of said electrically conductive film but electrically isolated therefrom, said contact surface lying outside the periphery of said aperture and accessible through recesses;
    an IC-chip positioned in the aperture of said carrier stratum;
    connection means in said recesses for connecting said IC-chip to said contact surfaces, said connection means being unsupported by said carrier stratum; and
    a hardened resin filling said aperture and recesses, said resin surrounding said IC-chip in said aperture and said connection means in said recesses.

2. A carrier element according to claim 1 wherein said connection means are fine wires.

3. The combination of a card-like member and a carrier element contained therein: said carrier element comprising a single layer carrier stratum having an aperture with a periphery and recesses through said stratum outside the periphery of said aperture; an electrically conductive film laminated to said carrier stratum and spanning said recesses; contact surface formed out of said electrically conductive film but electrically isolated therefrom, said contact surfaces lying outside the periphery of said aperture and accessible through said recesses; an IC-chip positioned in the aperture of said carrier stratum; connection means for connecting said IC-chip to said contact surfaces in said recesses, said connection means being unsupported by said carrier stratum; and cast, hardened resin surrounding said IC-chip in said aperture and said connection means in said recesses for protecting them against mechanical forces.

* * * * *